United States Patent [19]

Gundlach et al.

[11] Patent Number: 4,481,050

[45] Date of Patent: Nov. 6, 1984

[54] METHOD OF MAKING A THREE-DIMENSIONAL PHOTOGRAPH

[76] Inventors: Gregory E. Gundlach; Grayson Marshall, both of 1446 W. Grace, Chicago, Ill. 60613

[21] Appl. No.: 417,855

[22] Filed: Sep. 14, 1982

[51] Int. Cl.³ .............................................. B44F 7/00
[52] U.S. Cl. ..................................... 156/58; 156/285; 350/167; 354/101; 354/112; 354/115; 428/30; 428/167
[58] Field of Search .......................... 156/58, 59, 285; 354/112, 118, 122, 101, 110, 115; 428/29, 30, 167, 172, 182; 350/167

[56] References Cited

U.S. PATENT DOCUMENTS

| | | | |
|---|---|---|---|
| 3,392,647 | 7/1968 | Bartholomew | 354/112 |
| 3,392,648 | 7/1968 | Bartholomew | 354/112 |
| 3,491,669 | 1/1970 | McBride | 354/112 |
| 3,524,395 | 8/1970 | Alasia | 354/112 |
| 3,560,296 | 2/1971 | Anderson | 156/58 X |
| 3,608,457 | 9/1971 | Barker | 354/112 |
| 3,678,833 | 7/1972 | Leach | 354/112 |
| 3,687,048 | 8/1972 | Richter | |
| 3,769,890 | 11/1973 | Alasia | 350/130 X |
| 3,800,307 | 3/1974 | Wechsler | 354/112 |
| 4,128,324 | 12/1978 | Seeger | 354/112 |
| 4,158,501 | 6/1979 | Smith et al. | 354/112 X |

OTHER PUBLICATIONS

N. A. Valyus, Stereoscopy, pp. 117-128, (1966).

*Primary Examiner*—Robert Dawson
*Attorney, Agent, or Firm*—Allegretti, Newitt, Witcoff & McAndrews, Ltd.

[57] ABSTRACT

A method of making a high quality three-dimensional photograph is disclosed. The method utilizes a camera with a film mount therein, a rastor, a film, a separator for keeping the line rastor separate from the film, and a vacuum generating device for maintaining a vacuum in the vicinity of the separator thereby bringing the film into intimate contact with the separator and maintaining the intimate contact through successive exposures and movements of the film and line rastor. After repeated exposure of the film in various positions with respect to the subject being photographed, the film and rastor are laminated to opposing sides of the separator and the resulting photograph is viewed from the rastor-carrying side of the photograph by means of a light source and diffusion screen on the film-carrying side of the photograph.

18 Claims, 5 Drawing Figures

METHOD OF MAKING A THREE-DIMENSIONAL PHOTOGRAPH

BACKGROUND OF THE INVENTION

This invention relates to a method of making a three-dimensional photograph and to the photograph resulting from the method. More particularly, this invention relates to a method of making a three-dimensional photograph, and to a photograph resulting from the method, utilizing at least one rastor to generate the three-dimensional image.

Methods have long been known for generating photographs yielding varying qualities of three-dimensional images. Such three-dimensional photographs differ from traditional two-dimensional photographs in that the three-dimensional photographs yield an image not only having height and width, but also depth. That is, the three-dimensional photograph yields an image appearing to have spacial distances between various components in the image along an axis perpendicular to the plane or surface of the photograph.

One such method of making a three-dimensional photograph utilizes a lenticular screen in order to yield a three-dimensional image. The picture or image information is taken with a line rastor or lenticular screen placed between the film and the subject being photographed, and the position of the film with respect to the subject being photographed is substantially changed between repeated exposures of the film. Thereby, a series of parallel linear images (or "lineations") are printed on a backing layer of what becomes the final three-dimensional photograph.

The backing layer is then mounted on a lenticular screen so that the lineations are aligned with, and parallel to, the lenses on the lenticular screen. If the lineated images on the backing layer are comprised of different camera "views" of a subject taken from appropriately spaced positions of the film, line rastor, and subject, predetermined to provide parallax, the photograph yields an illusion of depth when viewed at appropriate distances from the lenticular screen.

As a practical matter, lenticular screen type three-dimensional photographs suffer from a lack of resolution and clarity because of the nature of the lenticular lens itself. Because it is prohibitively costly to make and use precision cut lenticular lenses, the lenticular screen is typically made out of rolled, cut, or molded plastics. Thus, the screen itself is thus filled with imperfections having a detrimental effect on the quality of the three-dimensional image.

Another problem with lenticular screen type three-dimensional photographs is their severely limited depth-of-field. Because of the inherent limitations of the refractive properties in the lenticular lenses in use and the short focal lengths necessary to produce the precise optics necessary for use of lenticular lenses, only a limited amount of 3-D information can be placed on the film backing in the form of lineations. Thus, the lack of 3-D information translates into a 3-D photograph with a shallow depth-of-field.

Another method of making a 3-D photograph utilizes a rastor not only to lay a series of images on the photograph, but also to view the photograph. Such methods require placing a first rastor in the camera between the unexposed film and lens of the camera, exposing the film with the subject in one position with respect to the film, then moving the subject and film with respect to one another, and re-exposing the film. This sequence is then repeated at least several more times.

The exposed film is then developed and printed or utilized in its developed state to generate the final 3-D image. Because of changes in the dimensions of the film stock during developing, another rastor, having dimensions different from the first rastor, must be used to view the image, or else the image must be enlarged as necessary so that the first rastor, or another rastor having dimensions identical to the first rastor, can be used. The rastor is placed over the print or film between the viewer and the film or print to generate the 3-D image for the viewer. If a print is used, frontal lighting of the 3-D photograph yields the 3-D image. If the developed film is used, backlighting of the 3-D photograph yields the 3-D image.

Such rastor type 3-D photographs in the prior art have also suffered from a variety of problems, including lack of clarity and resolution. In the methods of the prior art, the film stocks are dimensionally unstable. Thus, the rastor used to expose the film cannot be used to view the 3-D image unless the developed image is printed on an enlarged film or print stock. Whether a second rastor is used or the image is enlarged, the resulting 3-D image lacks clarity because of inaccuracy introduced by either using a second rastor of different dimensions than the first or by enlarging the print or film to attempt to match the developed image size with the original undeveloped image size. Either method is difficult, time consuming, costly, and a sure source of imperfection in the method, for when the rastor does not match up with the developed film completely correctly, the resulting 3-D image lacks resolution, clarity, and proper illusion of depth.

Another consequence of dimensional instability of the film stock is that wavering moiré patterns may result. These patterns will distort the 3-D image with phase shifts that are prohibitively disruptive, especially in large scale applications.

Another problem with methods that utilize rastors to make 3-D photographs has been their failure to maximize diffraction phenomena. Such methods have resulted in relatively poor resolution and clarity by failing to dimension the rastor to concentrate a single fresnel zone on the film during exposure of the film.

Other problems with rastor type 3-D photographs have been caused by the lack of 3-D information placed on the film stock. Because the ratio of rastor periodicity to separation distance (between the film and the rastor) have been low, the number of lineations or separate images placeable on the film without overlap has been fairly low. Moreover, the materials used to separate the film stock and rastor during exposure and viewing have not had the high degree of refraction desirable in order to "compress" more photographic information into a given space on the film stock. This lack of 3-D information results in a narrow depth-of-field.

Another problem with the rastor type methods of the prior art has been the inability of such methods to allow the film to be quickly and easily mounted within, or removed from, the camera for developing. During exposure, the film must be separated from the rastor by a uniform, predetermined distance, but methods of so aligning the film have been cumbersome and inaccurate. One such method holds the film and rastor in position during exposure by means of mechanical clips on a frame holding the rastor and film. The method causes imperfections in the resulting 3-D image, however, because of two sources of error in maintaining uniform separation between the film and rastor during exposure and viewing.

First, the movement of the film and rastor during exposure can introduce movement of film with respect to the rastor. Second, after removing and developing the film, re-mounting for viewing on a mechanical frame and clip apparatus leaves great room for error and non-uniformity of separation. Because uniformity of separation is critical for a quality 3-D image, such sources of non-uniformity greatly degrade the resulting 3-D image.

Other rastor type 3-D methods of the prior art do not move the rastor and film as a unit with respect to the subject being photographed. Instead, they allow both the rastor and subject to move while holding the film stationary. Such methods add another source of error or imperfection because the movements of the rastor with respect to the film must be extremely precise, requiring a cumbersome, precision rastor moving mechanism.

It is therefore an object of the present invention to develop a method of making a 3-D photograph that does not utilize lenticular lenses or any similar lenses, such as certain types of aperture rastors.

It is also an object of the present invention to develop a method of making 3-D photographs utilizing a rastor to expose and view the 3-D image but without requiring either enlargement of the developed image or utilization of a rastor during viewing that has different dimensions than the rastor used during exposure.

Another object of the present invention is to improve the quality of 3-D photographs, especially large scale 3-D photographs. In prior methods the detrimental qualities of moiré distortion (wavering phase shifts) and information loss (associated with second or third generation prints made from smaller transparencies) were greatly accentuated, especially on larger scales.

Yet another object of the present invention is to develop a method of making a 3-D photograph that easily and efficiently maintains uniform separation between the rastor and film or print during both exposure of the film and during viewing of the 3-D image.

Another object is to enable the production of first generation images (that is, to enable the film stock used in the first generation to be used in display of the 3-D photograph) in order to obtain optimum resolution, color density, contrast, and realism.

A further object is to develop such a method utilizing a refractive material between the film and rastor or print during exposure of the film and while viewing the 3-D image in order to "compress" more 3-D information into a given space on the film and increase the depth-of-field of the 3-D photograph.

Yet another object is to develop a method of making a 3-D photograph, utilizing a rastor having dimensions that maximize diffraction phenomena by concentrating a single fresnel zone on the film during each exposure of the film.

An additional object is to develop a method of manufacturing a 3-D photograph that can be mass produced in an economical, efficient and quick way.

There are other objects and advantages of the present invention. They will become apparent as the specification proceeds.

SUMMARY OF THE INVENTION

The foregoing and other objects and advantages are accomplished by our invention of both (a) a method of making a three-dimensional photograph of a subject and (b) the three-dimensional photograph resulting from the method. The method utilizes a dimensionally stable, unexposed film stock, at least one line rastor having a predetermined periodicity, and a camera. The camera includes a film mount and a shutter therein. The method comprises (a) mounting the film stock and line rastor on the film mount so the film stock is substantially parallel to, and separated by a predetermined distance from, the line rastor;

(b) at least once focusing the lens on the subject, activating the shutter, presenting a different view of the subject with respect to the film stock, and opening and closing the shutter again;

(c) removing the film stock from the camera and developing the film to produce an image; and (d) assembling the three-dimensional photograph by arranging the developed film stock and line rastor so the film stock is substantially parallel to, and separated by a predetermined distance from, the line rastor whereby a three-dimensional image can be viewed from the side of the line rastor furthest from the developed film stock.

BRIEF DESCRIPTION OF THE DRAWING

The preferred embodiment of this invention is shown in the accompanying drawing wherein.

DETAILED DESCRIPTION OF THE PREFERRED EMBODIMENT

Figure 1:
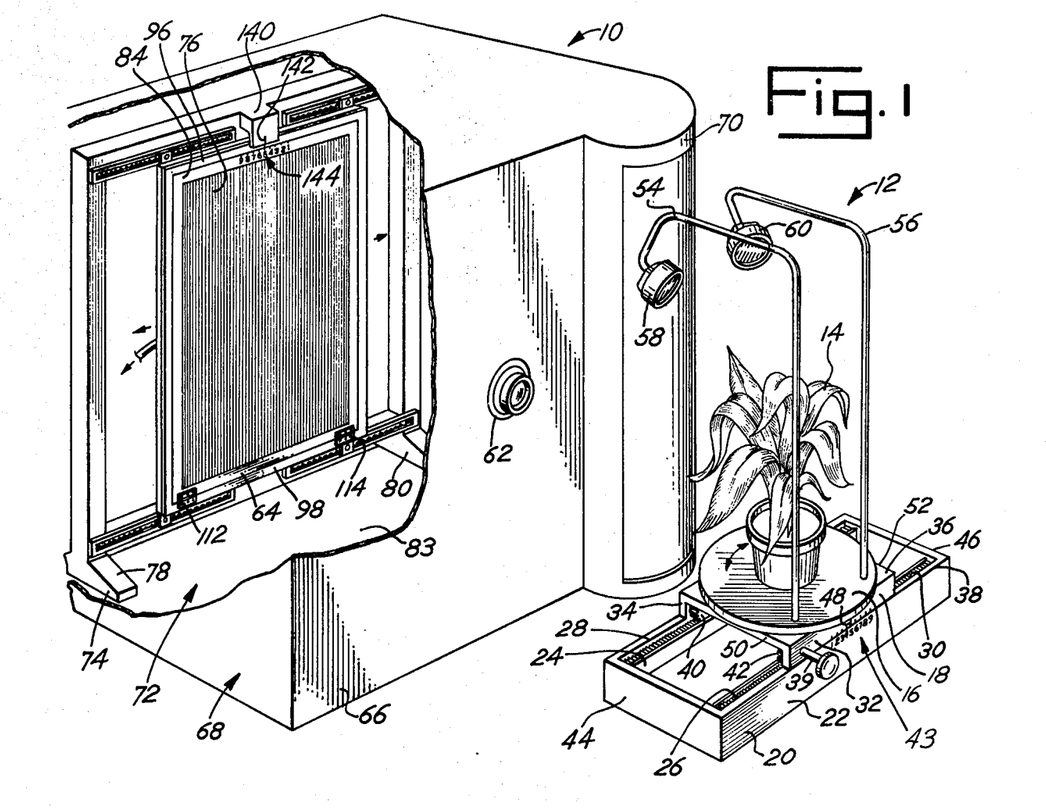
FIG. 1 is a pictoral view of the camera and mounting track with a portion of the camera housing removed to show the arrangement of the film mounting apparatus within the camera.

As shown in FIG. 1, the preferred embodiment utilizes a camera, generally 10, and a mounting platform, generally 12. A twenty-one and one-half inch wide, as measured along a horizontal axis, and thirty inch tall, as measured along a vertical axis, subject 14 on the mounting platform 12 is photographed with the camera 10 to yield a forty-three inch wide and sixty-inch tall 3-D photograph (not shown in FIG. 1) of the subject 14.

The mounting platform 12 consists of a rotatable table 16, a slidable carrier 18 supporting the rotatable table 16, and a fixed base 20 on which the slidable carrier 18 is slidably mounted. The fixed base 20 has a rectangular frame 22 and a first rack 24 and a second rack 26 mounted in parallel on the inner periphery of the first two parallel sides 28, 30 (respectively) of the rectangular frame 22.

The slidable carrier 18 has two parallel arms 32, 34 extending downward from a rectangular midsection 36.

The two arms 32, 34 slidably rest on the upper surface 38 of the first two parallel sides 28, 30 (respectively) of the rectangular frame 22. A control bar 39 is rotatably mounted in the parallel arms 32, 34 transverse to the arms 32, 34 and extends about three inches past the periphery of the frame 22 to provide a grip for manual rotation of the control bar 39. A first pinion gear 40 is mounted on the control bar 39 to firmly engage the teeth of the first rack 24, and a second pinion gear 42 is mounted on the control bar 39 to firmly engage the teeth of the second rack 26. The control bar 39 thus provides a means for controllably sliding the slidable carrier 18 along the upper surface 38 of the rectangular frame 22.

Nine linearly aligned spacing indicia, generally 43, are printed along a horizontal line on the outer periphery of the rectangular frame 22 near the upper surface 38 of the frame 22. The distance between each pair of adjacent spacing indicia 43 is 31/32 inch. The spacing indicia 43 are centered on the frame 22 so that the center (fifth) mark is equidistant from the second parallel sides 44, 46 of the frame 22.

A center mark 48 is printed on the arm 32 of the slidable carrier 18 abutting the side of the frame 22 having the spacing indicia 43. The center mark 48 is equidistant from the outer ends 50, 52 of the carrier 18 and abuts the upper surface 38 of the frame 22.

The rotatable table 16 is rotatably mounted on the midsection 36 of the slidable carrier 18. The radial center of the rotable table 16 lies in a plane passing through center mark 48 perpendicular to the plane of spacing indicia 43.

Two lamps 54, 56 are mounted near the outer circumference of the rotatable table 16 to extend over, and cast light upon, the subject 14, which is placed in the radial center of the rotatable table 16. The light source 58, 60 on each lamp 54, 56 (respectively) is a Lowel Quartz 3200K and is spaced about three feet from the subject 14 on the rotatable table 16. The light sources 58, 60 are arranged so that light reflected from the subject 14 can pass through the lens 62 and strike the film mount 64 at the back of the camera 10.

The camera 10 has a generally box-like body, generally 66, consisting of black plastic sheeting 68 covering a substantially box-like aluminum tube frame (not shown). A light proof rotating door 70 is located at one corner of the body 66 to allow the operator (not shown) to enter into the inner cavity, generally 72, of the camera body 66. A lens 62, 1000 mm. Zeiss, is mounted in the front face of the body 66 so that the lens 62 can be focused on the subject 14 to pass light reflected from the subject 14 to the film mount 64 at the back of the camera 10. A shutter and shutter operating mechanism (not shown) are mounted on the lens 62 to control the quantity of light allowed to pass through the lens 62 to the film mount 64.

Figure 2:
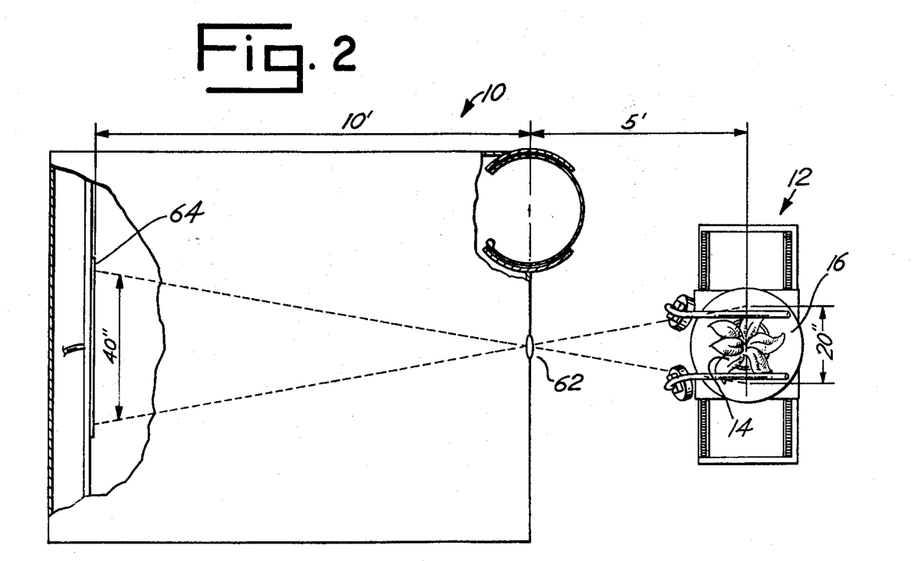
FIG. 2 is a plan view showing the positioning of the camera, lens, film, and subject with respect to one another.

As shown in FIG. 2, the distance from the lens 62 to the subject 14 is five feet as measured along a line perpendicularly extending from the plane of the lens 62 to the radial center of the rotatable table 16. The distance from the lens 62 to the film mount 64 is ten feet as measured along a line perpendicularly extending from the plane of the lens 62 to the plane of the vertical side of the film mount 64 nearest the lens 62.

As shown in FIG. 1, the film mount 64 consists of a vertically-standing rectangular outer support 74 and a slidable film carriage 76 mounted within the inner periphery of the outer support 74. The outer support 74 is constructed of 2"×4" wood, measures six feet wide by six feet tall, and has two pods 78, 80 that support the entire film mount 64 on the floor 83 of the camera 10. The vertical plane of the slidable film carriage 76 is parallel to the plane of the lens 62.

Figure 3:
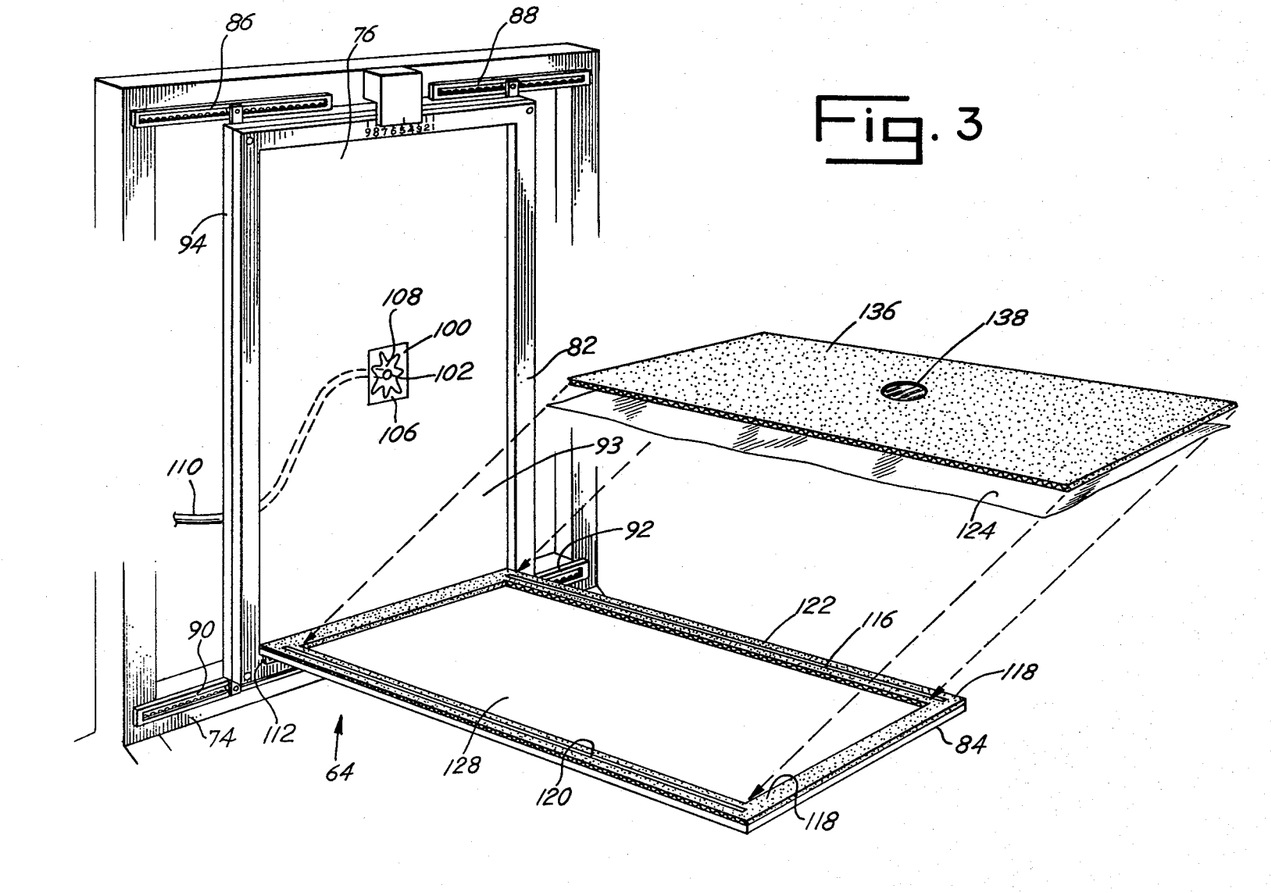
FIG. 3 is a perspective view of the film mount as it is used to mount film in the camera.

With reference to FIG. 3, the slidable carriage 76 has a rectangular outer frame 82 supporting an inner frame 84. The rectangular outer frame 84 is mounted on four horizontal bearing tracks 86, 88, 90, 92 on the inner periphery of the outer support 74 so that the outer frame 82 stands vertically and slides horizontally within the outer support 74.

Figures 4, 5:
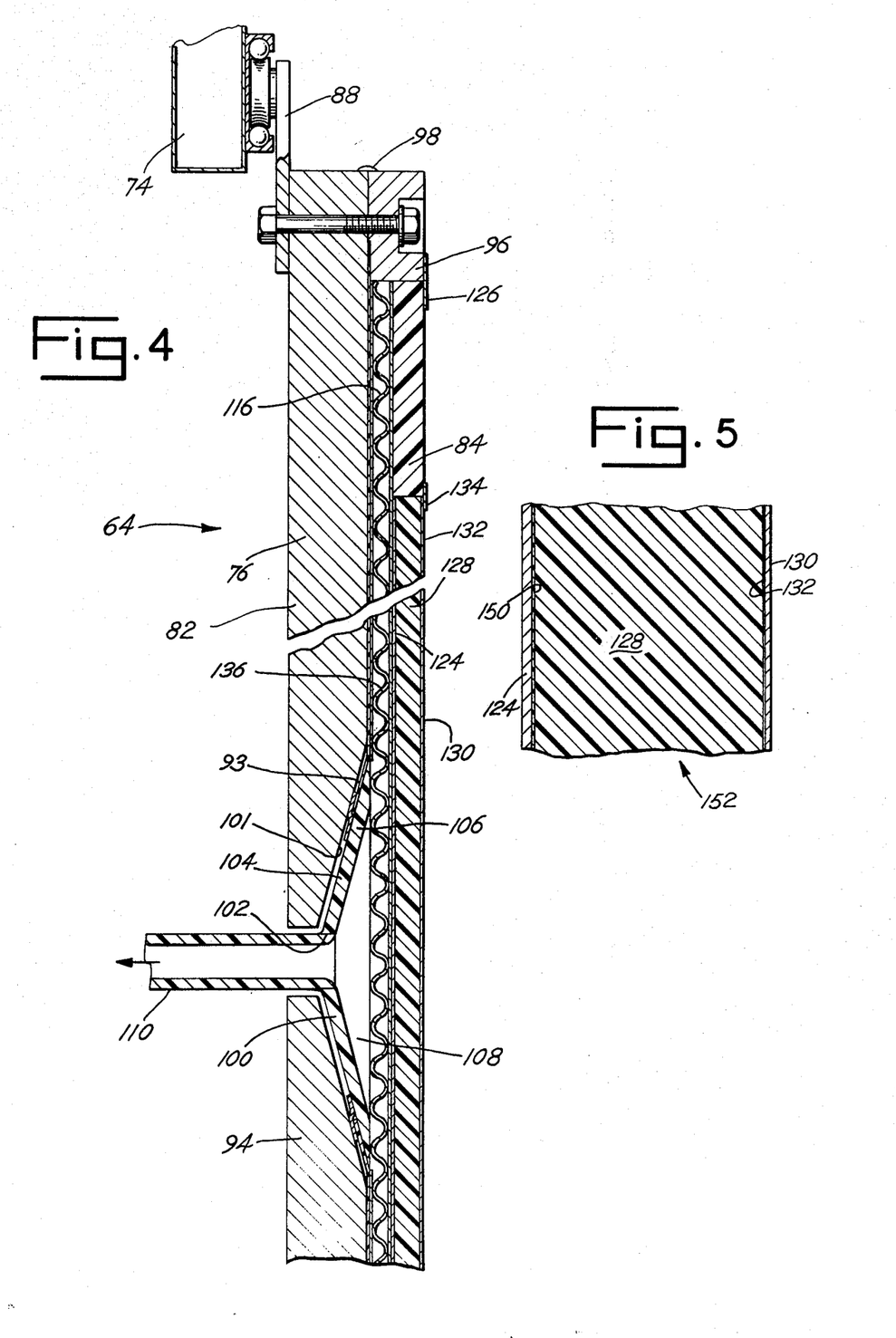
FIG. 4 is a cross-sectional view of a portion of the film mount showing the arrangement of the cardboard insert, film, separator, and line rastor within the container in the film mount.
FIG. 5 is a cross-sectional view of a portion of the assembled sandwich of material resulting in the 3-D photograph.

With reference to both FIGS. 3 and 4, the rectangular outer frame 82 has a rectangular wood backing 94 to which the bearing tracks 86, 88, 90, 92 are bolted, one at each corner of the frame 82. Strong plastic sheeting 93 covers the side of the wood backing 94 nearest the lens (not shown in FIGS. 3 or 4). A $\frac{1}{2}$" thick, 47"×64" O.D, 45×62" ID., rectangular outer frame 96 is bolted to the entire periphery of the wood backing 94 on the side of the wood backing 94 nearest the lens 62. An air-tight sealant 98 surrounds the periphery of the outer frame 82 at the junction of the wood backing 94 and outer frame 96.

A rectangular acrylic vacuum port 100 is mounted in a rectangular opening 101 in the center of the wood backing 94 and the plastic sheet 93. The acrylic vacuum port 100 has a vacuum tube passage 102 on the side 104 of the vacuum port 100 facing away from the lens 62 of the camera 10 (not shown in FIG. 3). The side 104 of the acrylic port 100 facing away from the lens 62 (not shown in FIG. 3) is taped or glued with air-tight tape or glue, such as epoxy cement, to the plastic sheet 93 around the entire opening of the sheet 93 surrounding the port 100. The side 106 of the acrylic vacuum port 100 facing the lens 62 (not shown in FIG. 3) has a rectangular outer periphery that is flush with surface of the side of the plastic sheet 93 nearest the lens 62. However, an irregular cavity 108 cut in the flush side 106 of the vacuum port 100 leads to and joins with the vacuum tube passage 102. A vacuum tube 110 penetrates the vacuum tube passage 102 and an airtight sealant joins the vacuum tube 110 to the vacuum tube passage 102. The end of vacuum tube 110 opposite the vacuum port 100 is attached to a vacuum generator (not shown) capable of drawing a vacuum of 21 inches of Hg.

As shown in FIGS. 1 and 3, the inner frame 84 is vertically rotatable within the outer frame 82 by means of two hinges 112, 114 joining the lowest horizontal side of the outer frame 82 nearest to the lens 62 with the inner frame 84. The dimensions of the outer periphery of the inner frame 84 are nearly identical to the dimensions of the inner periphery of the outer frame 82. Thus, when the inner frame 84 is rotated about the hinges 112, 114 into a vertical position within the outer frame 82, the side of the inner frame 84 nearest the lens (not shown in FIG. 3) is flush with the side of the spacer 96 nearest the lens 62. The inner frame 84 is only one-fourth inch deep so that there is a one-fourth inch separation between the wood backing 94 and inner frame 84.

A one-fourth inch thick corrugated cardboard spacer 116 is glued to the inner frame 84 and covers the entire surface of the inner frame 84 facing towards the wood backing 94 when both the cardboard spacer 116 and inner frame 84 are in the vertical position. The cardboard spacer 116 thus occupies the space in the separation between the plastic sheet 93 and the inner frame 84 when the inner frame 84 is flush with the outer frame 82. As shown in FIG. 3, the inner surface 118 of the cardboard spacer 116, which abuts the plastic sheet 93 when the inner frame 84 is in the vertical position, has two vertical slits 120, 122, one in each vertical side of the cardboard spacer 116. The slits 120, 122 penetrate the corrugation in the cardboard spacer 116 to provide a means for air to pass from the inner surface 118 of the cardboard spacer 116 to the passages within the corrugation in the cardboard spacer 116.

As shown in FIG. 4 for the film mount 64 when loaded with film 124, the inner frame 84 is held flush against the outer frame 82 by means of air-tight sealing tape 126 surrounding the entire junction of the outer periphery of the inner frame 84 with the inner periphery of the outer frame 82.

The inner periphery of the inner frame 84 is rectangular and forty-three inches wide (horizontal) and sixty inches tall (vertical). A forty-three by sixty by one-fourth inch rectangular, optically clear acrylic separator 128 is mounted within the inner periphery of the inner frame 84 so that the sixty inch sides of the separator are vertical and the forty-three inch sides are horizontal and abutting the horizontal sides of the inner frame 84. A sixty by forty-three inch line rastor 130 is aligned without being laminated to the acrylic separator 128 by means of a one mil thick optically clear, double sided sheet adhesive 132, such as Mac Tac, manufactured by Morgan Adhesives, Stow, Ohio. The line rastor 130 is laminated to the side of the acrylic separator 128 nearest the lens (not shown in FIG. 4). The acrylic separator 128 and the line rastor 130 are retained within the inner frame 84 and plastic sheet 93 so that the line rastor 130 is flush with the surface of the inner frame 82 facing the lens (not shown in FIG. 4) by means of air-tight sealing tape 134 surrounding the entire junction of the inner periphery of the inner frame 84 with outer periphery of the line rastor 130.

The line rastor 130, when oriented vertically in the camera 10, has vertical lineations and is 80% dark with a 1/40" periodicity. The line rastor 130 is made from Kodak Kodalith Orthographic Type 3 film.

The acrylic separator 28 has an index of refraction of 1.49 and is made from acrylic sheeting manufactured by Rohm & Haas Manufacturing Co.

The film 124 lies between a removable cardboard insert 136 and the side of the acrylic separator 128 facing away from the lens (not shown in FIG. 4). The cardboard insert 136, which is about ¼" thick, thus lies between the plastic sheet 93 and the film 124. The film 124 and cardboard insert 136 are also each forty-three inches wide by sixty inches tall and are each mounted in the inner periphery within the inner frame 84 so that the sixty-inch sides are vertical and the forty-three inch sides are horizontal and abutting the horizontal sides of the inner frame 84.

The film 124 is Ilford Cibachrome II CTD.f7 transparency film with a 0.18 mm. transparent polyester base. The ASA rating of the film is about 1/54 of an ASA unit. The film 124 is very stable dimensionally so that, after the film 124 is developed, the film 124 retains dimensions nearly identical to the pre-exposure dimensions of the film 124.

As shown in FIG. 3, the cardboard insert 136 has corrugations that mate with the corrugations of the cardboard spacer 116. A vacuum passage 138 is cut in the center of the cardboard insert 136 on the side of the cardboard insert 136 that, as shown in FIG. 4, abuts the acrylic vacuum port 100. The cardboard insert 136 is mounted within the inner periphery of the inner frame 84 so that the vacuum passage 138 abuts the vacuum port 100 and allows air to be drawn through the corrugations in the cardboard spacer 116 and cardboard insert 136.

The tape 134, 126 used to seal the sandwich of materials within the outer frame 82 and inner frame 84 is a strong plastic sheet, such as polyethylene 4 mil sheet, capable of creating an air tight seal at 21" Hg. Thus, when the sandwich of material is sealed in the film mount 64 and a vacuum is drawn through the vacuum port 100, the cardboard insert 136 is drawn into tight, intimate, and secure contact with the plastic sheet 93 and with the film 124, and the film 124 is brought into tight, intimate, and secure contact with the acrylic separator 128.

It can thus be seen that the outer frame 82, sealant 98, sealing tape 126, inner frame 84, plastic sheet 93, and vacuum port 100 form a container for the cardboard spacer 116, cardboard insert 136, film 124, acrylic separator 128, and line rastor 130. The container is sealed by means of the sealing tape 134 and line rastor 130 so that the area bounded by the container, the sealing tape 134, and the line rastor 130 is relatively air-tight and capable of providing the vacuum described above.

Other container arrangements would also suffice to provide the vacuum sandwich of materials described herein. For example, a plastic envelope that is at least partially optically clear can serve as a container for the sandwich of materials including the cardboard insert 136, the film 124, the acrylic separator 128, and the line rastor 130 and when the envelope is sealed, a vacuum can be drawn to draw the sandwich securely together.

As shown in FIG. 1, a center bar 140 extends from the outer support 74 in the horizontal center of the top of the outer support 74. A vertical centering line 142 in the center of the center bar 140, as measured in a plane parallel to the plane of the lens 62 when the center bar 140 is horizontal and parallel to the plane of the lens 62, lies in a plane that is perpendicular to the plane of the lens 62 and that penetrates the radial center of the rotatable table 16.

On the edge of the inner frame 84 nearest the center bar 140 are nine guide marks 144. Each pair of adjacent guide marks 144 is spaced apart from each other by 1 30/32 inch. The center (fifth) guide mark 144 lies in a plane passing through the vertical length of the vertical centering line 142.

With reference to FIGS. 1, 2, 4, and 5, the method of making the 3-D photograph entails the following:

(a) The line rastor 130 is laminated to one side of the acrylic separator 128 with the sheet adhesive 132;

(b) The acrylic separator 128 is then placed in the inner periphery of the inner frame 84 and taped in place with the sealing tape 134 so that the line rastor 130 is flush with the surface of the inner frame 84 nearest the camera 10 when the inner frame 84 is in the vertical position;

(c) With the inner cavity 72 of the camera in total darkness from the beginning of this step through the film removal step (s), the film 124 is placed against the acrylic separator 128 with the photosensitive emulsion side of the film 124 in contact with the side of the acrylic separator 128 opposite the side facing the line rastor 130;

(d) The cardboard insert 136 is placed against the side of the film 124 opposite the side in contact with the acrylic separator 128;

(e) The inner frame 84 is swung into a vertical position and taped in place with sealing tape 126 all around the outer periphery of the inner frame 84 so that the side of the inner frame 84 nearest the lens 62 is flush with the side of the outer frame 82 nearest the lens 62 and so that the area bounded by the plastic sheet 93, vacuum port 100, outer frame 82, sealing tape 126, inner frame 84, sealing tape 134, and line rastor 130 is relatively air tight;

(f) A vacuum is drawn in the bounded area (described above) with the vacuum machine (not shown);

(g) The slidable carriage 76 is positioned so that the centering line 142 is aligned vertically over the guide mark 144 that is furthest to the right of the center (fifth) guide mark 144 as the outer frame 82 is viewed from the position of the lens 62;

(h) The slidable carrier 18 is aligned so that the center mark 48 is aligned vertically over the spacing indicia 43 that is furthest to the right of the center (fifth) spacing indicia 43 as the rectangular frame is viewed from the position of the lens 62;

(i) The lamps 58, 60 are turned on, and the lens 62 is focused on the subject 14;

(j) The shutter of the lens 62 is activated or opened for forty minutes and then closed;

(k) The slidable carriage 76 is repositioned so that the centering line is vertically aligned over the next guide mark 144 to the left as the outer frame 82 is viewed from the position of the lens 62;

(l) The slidable carrier 18 is re-aligned so that the center mark 48 is aligned vertically over the next spacing indicia 43 to the left as the outer frame 82 is viewed from the position of the lens 62;

(m) The turntable may be swiveled clockwise to enhance, or counter-clockwise to mitigate, the stereo effect;

(n) The lens 62, with the aperture at f/64 for optimum depth-of-field without pinhole diffraction effect, is refocused on the subject 14;

(o) The shutter of the lens 62 is opened for forty minutes and then closed;

(p) Steps (k)–(o) are repeated seven more times for a total of nine separate, sequential exposures of forty minutes each at each position along the guide marks 144 and the spacing indicia 43;

(q) The vacuum machine (not shown) is turned off so that a vacuum is no longer drawn in the bounded area;

(r) The sealing tape 134 sealing the junction of the inner frame 84 and outer frame 84 is removed, and the inner frame 82 is rotated into a horizontal position;

(s) The cardboard insert 136 is removed from the inner frame 84;

(t) The film 124 is removed from the inner frame 84 and developed to yield a photograph having nine separate images per 1/40 inch;

(u) the sealing tape 126 sealing the junction of the inner frame 84 and line rastor 130 and holding the line rastor 130 flush with the side of the inner frame 84 is removed, and the laminated acrylic separator 128 and line rastor 130 are removed from within the inner frame 84;

(v) With specific reference to FIG. 5, the developed film 124 is placed on the side of the acrylic separator 128 opposite the side facing line rastor 130, a light source (not shown) is placed on the side of the film 124 opposite the acrylic separator 128, and a light diffusion screen (not shown) is placed between the light source (not shown) and acrylic separator 128 to cause light from the light source to flood the entire side of the acrylic separator 128 opposite the side facing the line rastor 130;

(w) The emulsion side of the developed film 124 is placed in contact with the acrylic separator 128 on the side of the acrylic separator 128 opposite the side facing the line rastor 130, and the position of the developed film 124 with respect to the acrylic separator 128 is manually adjusted to discover the position that yields the best quality three-dimensional image (having the fewest interference patterns and most realistic three-dimensional image) when the illuminated film 124 is viewed through the line rastor 130; and (x) The position of the film 124 on the acrylic separator 128 is then marked, and the film 124 is then laminated to the acrylic separator in that position by means of an optically clear, one mil thick sheet adhesive 150, such as Mac Tac.

The resulting 3-D photograph 152 can best be viewed by putting a light source (not shown) on the film-carrying side of the photograph 152 and then placing a light diffusion screen (not shown) between the light source and the photograph 152 in order to pass light evenly across the film-carrying side of the photograph 152 toward the line rastor-carrying side of the photograph 152. A very high quality enlarged three-dimensional image of the subject 14 can then be seen by viewing the photograph from the line rastor-carrying side of the photograph 152. The 3-D image can be seen from as close as two feet from the photograph 152 to as far away as at least twenty-five feet from the photograph 152 on the line rastor-carrying side of the photograph 152. Moreover, movement from side to side (as measured from a plane perpendicular to the plane of the line rastor 130 and parallel to a linneation in the line rastor 130) on the line rastor-carrying side of the separator 128 yields a realistic impression of simply viewing the object itself (in three dimensions) since the view changes in a very realistic and three-dimensional way as the viewer moves from side to side of the photograph 152.

The preferred method and apparatus disclosed herein are only one of the many variations possible that will yield a high quality three-dimensional photograph while using our invention herein disclosed. For example, the distances set forth for the lens-to-object, lens-to-film mount, and inter-marker and inter-indicia spacing are designed to yield a 43"×60" enlarged image of a subject 30" tall by 21.5" wide. Different size films can be utilized to make smaller photographs of smaller objects, and rearrangement of the above-noted distances, along with appropriately matched lenses, line rastors, and separators, using well-known optical formulas and relationships, will yield varying sizes of photographs and varying degrees of enlargement, reduction, or anything inbetween.

As another example, while the preferred method utilizes ¼" acrylic separator 128 with an 80% dark, 40 line/inch rastor 130, it is possible to use other thicknesses of acrylic separators or other rastors as long as slit width (the width of an optically clear lineation on the rastor 130), lens-to-rastor distance, and thickness of acrylic separator are all matched on the basis of laws governing Fresnel diffraction phenomena. For example, we have used a ⅛" inch acyrlic separator with an 80% dark, 63 line/inch rastor and obtained excellent results. The object is to concentrate a single bright Fresnel zone behind each rastor during each exposure of the film.

The preferred embodiment disclosed herein provides a 3-D photograph having a great quantity of 3-D information translating into a 3-D photograph with a deep depth-of-field. The method is relatively easy to perform, less time consuming, and more accurate than the methods in the prior art since, among other things, a dimensionally stable film is used and held rigidly in place with respect to the line rastor and separator during repeated exposure of the film. Moreover, the inaccuracy of lenticular lenses has been totally eliminated.

Since the invention as disclosed herein may be embodied in many other specific forms without departing from its nature or central characteristics, the preferred embodiment herein described must be considered simply as illustrative and not restrictive. The scope of this invention is thus indicated by the following claims rather than the foregoing detailed description, and all changes that come within the meaning and range of equivalency of the claims are intended to be embraced therein.

What is claimed is:

1. A method of making a three-dimensional photograph of a subject, said method utilizing a dimensionally stable, unexposed film stock, at least one line rastor having a predetermined periodicity, and a camera including a film mount and a shutter therein, the method comprising:
   (a) mounting the dimensionally stable, unexposed film stock and the line rastor having a predetermined periodicity on the film mount such that the film stock is substantially parallel to, and separated by a predetermined distance from, the line rastor;
   (b) at least once focusing the camera on the subject, activating the shutter, presenting a different view of the subject with respect to the film stock, and reactivating the shutter again;
   (c) developing the film stock to produce an image; and
   (d) assembling the three-dimensional photograph by arranging the developed film stock and the line rastor such that the film stock is substantially parallel to, and separated by the predetermined distance from, the line rastor whereby a three-dimensional image can be viewed from the side of the line rastor furthest from the developed film stock.

2. The method of claim 1 wherein the mounting step includes placing a separator between the film stock and line rastor and drawing a vacuum around at least a portion of the surface of the separator in order to draw the film stock into substantially intimate contact with the separator.

3. The method of claim 2 wherein said separator has a first side and a second side opposite said first side and wherein the mounting step further includes inserting the film stock, separator, and line rastor into a container such that the film stock is in contact with the first side of the separator and the line rastor is in contact with the second side of the separator, then sealing the container, and drawing a vacuum in the sealed container.

4. The method of claim 3 wherein the mounting step also includes, prior to sealing the container, inserting a porous component in the container such that the porous component lies between a suction component in the wall of the container and the film stock and the drawing sub-step includes removing air from the sealed container through the suction component.

5. The method of claim 4 wherein, prior to the mounting step, the line rastor is laminated to the second side of the separator.

6. The method of claim 1 further utilizing at least one separator having a first side and a second side opposite the first side and wherein the assembling step includes placing the separator between the developed film stock and line rastor and laminating the line rastor to the first side of the separator and the developed film stock to the second side of the first separator.

7. The method of claim 6 wherein the mounting step includes placing the separator between the film stock and line rastor and drawing a vacuum around at least a portion of the surface of the separator in order to draw the film stock into substantially intimate contact with the separator.

8. The method of claim 7 wherein the mounting step includes inserting the film stock, separator, and line rastor into a container such that the film stock is in contact with the first side of the separator and the line rastor is in contact with the second side of the separator, then sealing the container, and drawing a vacuum in the sealed container.

9. The method of claim 8 wherein the mounting step further includes, prior to sealing the container, inserting a porous component in the container such that the porous component lies between the film stock and a suction component in the wall of the container.

10. The method of claim 9 wherein the mounting step includes, prior to the inserting step, laminating the line rastor to the separator and wherein the sealing step includes sealing the line rastor to the container.

11. The method of claim 1, 2, 3, 4, 5, 6, 7, 8, 9, or 10 wherein the film stock is a positive film stock and the separator is a translucent material having a refraction index greater than 1.0.

12. The method of claim 1 wherein the line rastor has dimensions chosen to minimize diffraction phenomena by concentrating a single bright Fresnel zone on the film during the shutter activating step.

13. A method of making a three-dimensional photograph of a subject, said method utilizing a dimensionally stable, unexposed positive film stock, a rigid porous component, at least one separator, at least one line rastor, a container, and a camera including a body with a cavity therein, a film mount in the cavity, and a lens in the body opposite the film mount, said lens having a light passage and a shutter means for opening and closing the light passage, said separator having a predetermined thickness, a first side, a second side opposite said first side, and a refraction index greater than 1.0, said line rastor having a predetermined periodicity, and said container having an opening bounded by an edge, a sidewall with an inner surface, and a suction component in the sidewall penetrating the inner surface, the method comprising:
   (a) laminating the line rastor to the second side of the separator;
   (b) inserting the rigid porous component, the dimensionally stable, unexposed positive film stock, the separator, and the line rastor into the container such that the film stock abuts the first side of the separator, and the rigid porous component lies between the film stock and the inner surface of the sidewall of the container;
   (c) sealing the container by sealing the line rastor to the edge of the opening in the container;

(d) drawing a vacuum in the sealed container by sucking air through the porous component and out of the sealed container so that the film stock is brought into intimate contact with the separator;

(e) mounting the sealed container in the film mount of the camera so that the second side of the separator faces the lens;

(f) at least once focusing the lens on the subject, activating the shutter, adjusting the position of the subject with respect to the container, and reactivating the shutter again;

(g) removing the film stock from the camera and the container and developing the film to produce an image; and (h) assembling the three-dimensional photograph by laminating the film stock to the first side of the separator whereby a three-dimensional image can be viewed from the side of the line rastor furthest from the developed film stock.

14. The method of claims 1, 2, 4, 6, 7, 9, 10, 12, or 13 wherein the method further comprises: backlighting the assembled three-dimensional photograph by disposing a light source on the first side of the separator.

15. The method of claims 1, 2, 4, 6, 7, 9, 10, 12, or 13 wherein the method further comprises: backlighting the arranged three-dimensional photograph by disposing a light source on the first side of the separator and positioning a light diffusion apparatus between the light source and film stock.

16. A method of making a three-dimensional photograph, said method utilizing a film stock, a separator, and a rastor in a camera having a body with a cavity and a film mount in the cavity, the method comprising:

(a) drawing a vacuum around at least a portion of the surface of the separator in order to draw the film stock into intimate contact with the separator;

(b) mounting the film stock in the film mount in the camera; and (c) exposing and developing the film stock.

17. The method of claim 16 wherein the separator has a first side and a second side opposite the first side and wherein the drawing step includes inserting the film stock, separator, and rastor into a container such that the film stock is in contact with the first side of the separator and the rastor is in contact with the second side of the separator, then sealing the container, and drawing a vacuum in the sealed container.

18. The method of claim 17 wherein the inserting step further includes, prior to sealing the container, inserting a porous component in the container such that the porous component lies between the suction component and the film stock.

* * * * *